(12) United States Patent
Vice et al.

(10) Patent No.: US 6,606,002 B1
(45) Date of Patent: Aug. 12, 2003

(54) COMMON DEVICE NODE BALUN GROUNDED BALANCED AMPLIFIER

(75) Inventors: Michael Wendell Vice, El Granada, CA (US); Michael Louis Frank, Los Gatos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/092,760

(22) Filed: Mar. 7, 2002

(51) Int. Cl.[7] .................................................. H03F 3/04
(52) U.S. Cl. ....................................... 330/301; 330/302
(58) Field of Search ................................ 330/301, 302, 330/116, 117, 165, 171

(56) References Cited

U.S. PATENT DOCUMENTS 5,977,834 A * 11/1999 Davis et al. ................ 330/302

OTHER PUBLICATIONS

*Advanced Design System 2002, Circuit Components, Introduction and Simulation Components*, Feb. 2002, available from Agilent Technologies, Inc. 3 pages (Cover Page; Chapter 1 Introduction; Term Symbol page).

* cited by examiner

*Primary Examiner*—Henry Choe

(57) ABSTRACT

An amplifier circuit includes an amplifier stage and a balun stage. The amplifier stage includes a common node connected to an external ground. An inductance is located between the common node and the external ground. The balun stage is connected to the amplifier stage. The balun stage includes a balun tail. The balun tail is directly connected to the common node of the amplifier stage so that a resulting connection between the balun tail and the common node bypasses the inductance between the common node and the external ground.

21 Claims, 5 Drawing Sheets

COMMON DEVICE NODE BALUN GROUNDED BALANCED AMPLIFIER

BACKGROUND

The present invention pertains to amplifiers and pertains particularly to a common device node balun grounded balanced amplifier.

A common drain amplifier with an ideally grounded drain can be designed that is unconditionally stable. However, in a practical implementation, the length of a bond wire, package lead and so on can result in nonzero drain inductance. The drain inductance introduces instability at various frequencies. The resistance values of the amplifier can be adjusted to re-acquire unconditional stability. However, this adjustment of resistance values can result in a loss of gain and decreased noise performance.

An output balun may take the form of a transformer or, more usually in integrated circuits, a lumped element inductance-capacitance (L-C) ladder structure. In the case of a transformer, the secondary winding has a center tap that is usually grounded. For the ladder type balun, there is a tail node, which is used to ground all of the shunt elements. Herein, the term "balun tail" is used to refer both to the center tap of the transformer and to the tail node of the ladder type balun.

When a balun has an ideal tail ground, amplitude and phase performance is maximized. However, in a practical implementation, the length of a bond wire, package lead and so on can result in nonzero tail inductance. The tail inductance deteriorates the amplitude and phase. The element values of the balun can be adjusted to compensate for tail inductance; however, this results in reduction of useful bandwidth of the balun and costly design iteration.

When an amplifier with drain inductance is integrated with a balun with tail inductance, the effects of the inductances are compounded. The drain inductance can cause the amplifier to be unstable at certain frequencies. In addition there is amplitude and phase deterioration caused by the tail inductance of the balun.

Correction of the stability problem can be accomplished by reducing the gain of the amplifier with additional resistance, resulting in a concomitant increase in noise. Further steps can be taken to improve the drain grounding by use of multiple bond wires and package pins. Additionally, multiple high-grade capacitors are required to bypass the drain node to ground. Phase and amplitude irregularities can be addressed by absorbing the tail inductance into the other component values of the balun, resulting in reduced bandwidth and costly design iteration.

SUMMARY OF THE INVENTION

In accordance with the preferred embodiment of the present invention, an amplifier circuit includes an amplifier stage and a balun stage. The amplifier stage includes a common node connected to an external ground. An inductance is located between the common node and the external ground. The balun stage is connected to the amplifier stage. The balun stage includes a balun tail. The balun tail is directly connected to the common node of the amplifier stage so that a resulting connection between the balun tail and the common node bypasses the inductance between the common node and the external ground.

DESCRIPTION OF THE PREFERRED EMBODIMENT

In preferred embodiments of the present invention, within a balanced amplifier circuit, a balun tail is connected directly to a common node of the amplifier circuit. The result is a dramatic reduction of the sensitivity of the amplifier circuit to the presence of grounding inductance. This allows construction of an amplifier stage having unconditional stability, higher gain, lower noise and reduced ground circuit complexity. Connecting the balun tail directly to the common node of the amplifier also provides for maximum balun performance without iteration.

The particular embodiments of the present invention described herein are meant to be illustrative. For example, in each of the embodiments disclosed in the figures, a field-effect transistor (FET) is used within the amplifier circuit; however, as will be understood by persons of ordinary skill in the art, a bipolar transistor, a tube amplifier or some other form of amplifier can be used instead of an FET. Likewise, the illustrated embodiments shown in the figures show the balun being implemented by a lumped element LC circuit; however, as will be understood by persons of ordinary skill in the art, a transformer or other type of balun may be used. In each case, however, connecting the balun tail directly to the common node of the amplifier results in increased circuit performance and stability.

Figure 1:
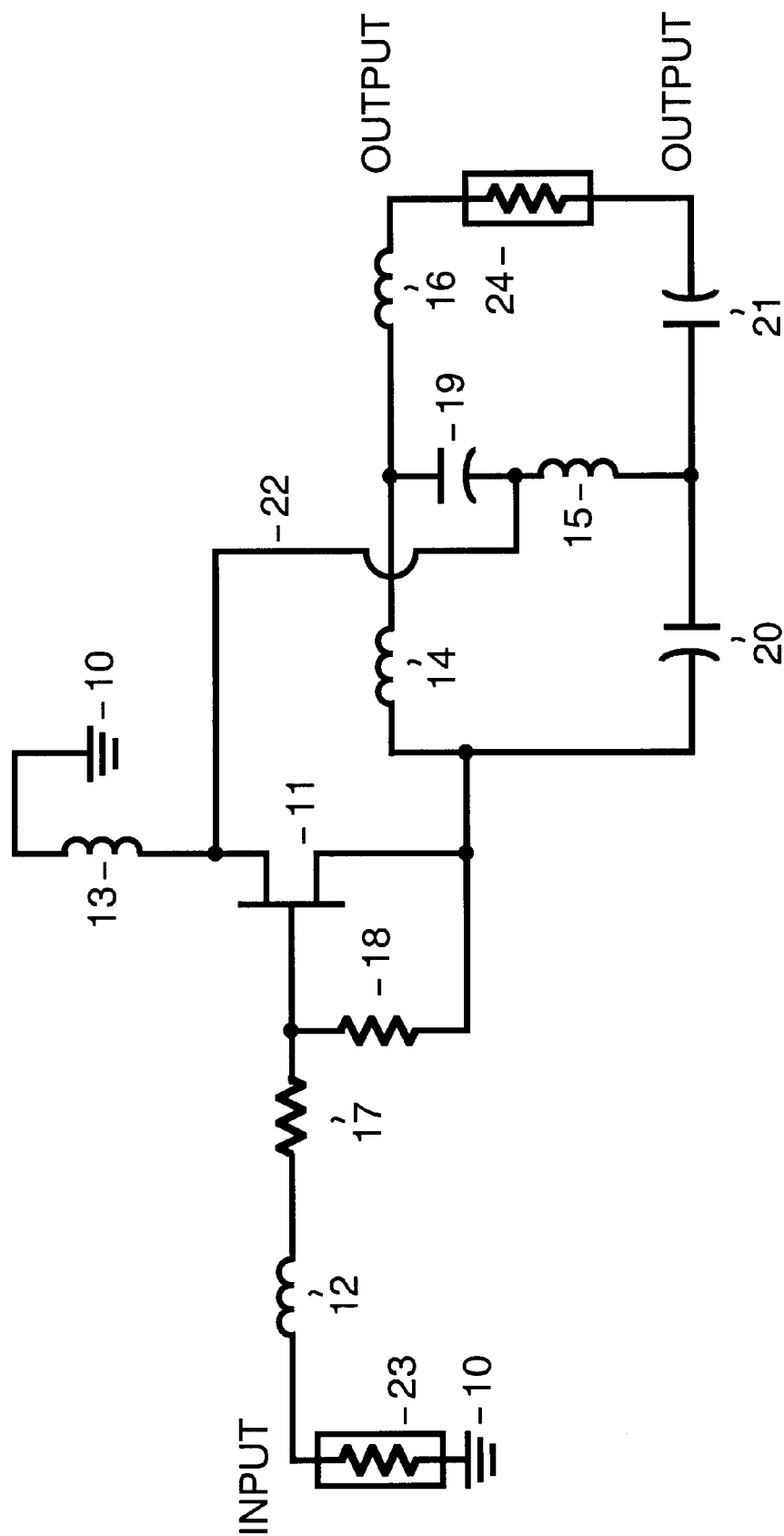
FIG. 1 shows a schematic representation of a common drain balanced output amplifier in accordance with a preferred embodiment of the present invention.

FIG. 1 shows a schematic representation of a common drain balanced output amplifier circuit. The schematic is for an alternating current (AC) simulation so that DC biasing circuitry is omitted.

An amplifier stage of the amplifier circuit includes an FET 11, a resistance 17 and a resistance 18. Resistance 17 and resistance 18 represent stabilizing and impedance matching elements for FET 11. As will be understood by persons of ordinary skill in the art, many other combinations may be used to accomplish the same purpose. For example, in some embodiments, resistance 17 and resistance 18 can be eliminated entirely. In other embodiments resistance 17 and resistance 18 can be replaced by a suitable combination of reactive elements.

An output stage (balun) of the amplifier circuit includes an inductance 14, an inductance 15, an inductance 16, a capacitance 19, a capacitance 20, and a capacitance 21, connected as shown. Also shown are an input port terminator 23 connected to a ground 10, an input inductance 12, a common node inductance 13, and an output port terminator 24. For example common node inductance 13 results, at least partially, from a bond wire and/or a package lead. A line 22 connects the tail of the balun to the common node of the amplifier. In this case, the common node of the amplifier is the drain of FET 11.

As will be understood by persons of ordinary skill in the art, implementation of a balun does not require all the elements shown in FIG. 1. For example, inductance 16 and capacitance 21 are optional elements that serve to enhance performance in particular circumstances. Of course, elimination of these elements would generally require adjustment of the values of other elements.

For example, the amplifier circuit has a start frequency of 0.8 Gigahertz (GHz), a stop frequency of 1.2 GHz and a step frequency of 0.01 GHz. Input port terminator 23 has an impedance of 350 Ohms. Inductance 12 has a value of 20 nanohenries (nH). Resistance 17 has a resistance of 90 Ohms. Resistance 18 has a resistance of 50 Ohms. FET 11 has a width of 1000 micrometers, a gate-to-source voltage ($V_{GS}$) equal to 0.5 volts and a drain-to-source voltage ($V_{DS}$) equal to 3 volts. Common node inductance 13 has a value of 2 nH. Inductance 14 has a value of 6.2 nH. Inductance 16 has a value of 0.83 nH. Inductance 15 has a value of 6.3 nH. Capacitance 20 has a value of 4.2 picofarads (pF). Capacitance 19 has a value of 4.2 pF. Capacitance 21 has a value of 19.5 pF. Output port terminator 24 has an impedance of 50 Ohms.

Figure 2:
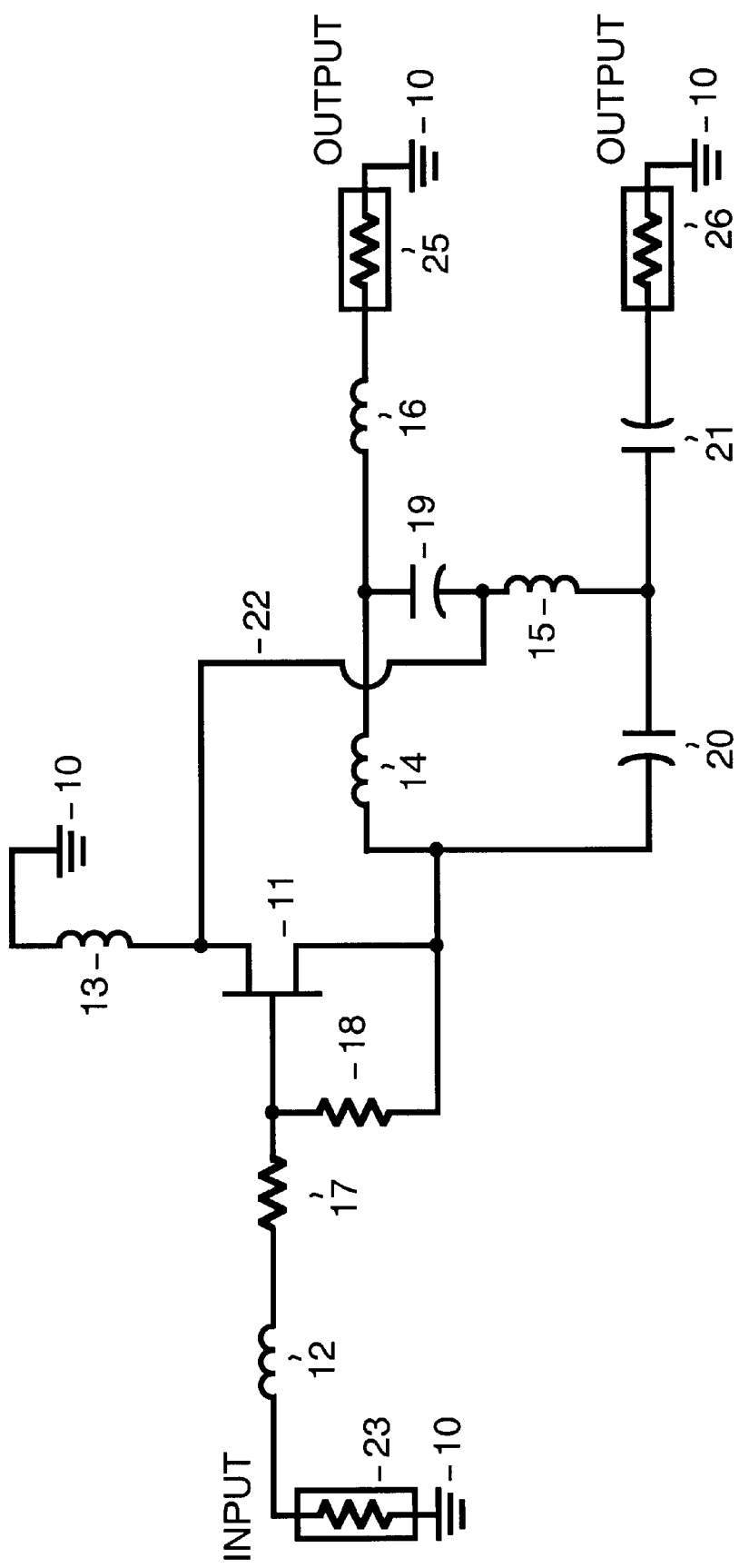
FIG. 2 shows a schematic representation of a common drain balanced output amplifier circuit with an alternate output termination in accordance with an alternative preferred embodiment of the present invention.

FIG. 2 shows a schematic representation of the common drain balanced output amplifier circuit shown in FIG. 1, modified to replace output port terminator 24 with an output port terminator 25 connected to ground 10 and an output port terminator 26 connected to ground. For example, output port terminator 25 has an impedance of 25 Ohms. Output port terminator 26 has an impedance of 25 Ohms. No other changes have been made to the amplifier circuit and all the element values remain the same.

Figure 3:
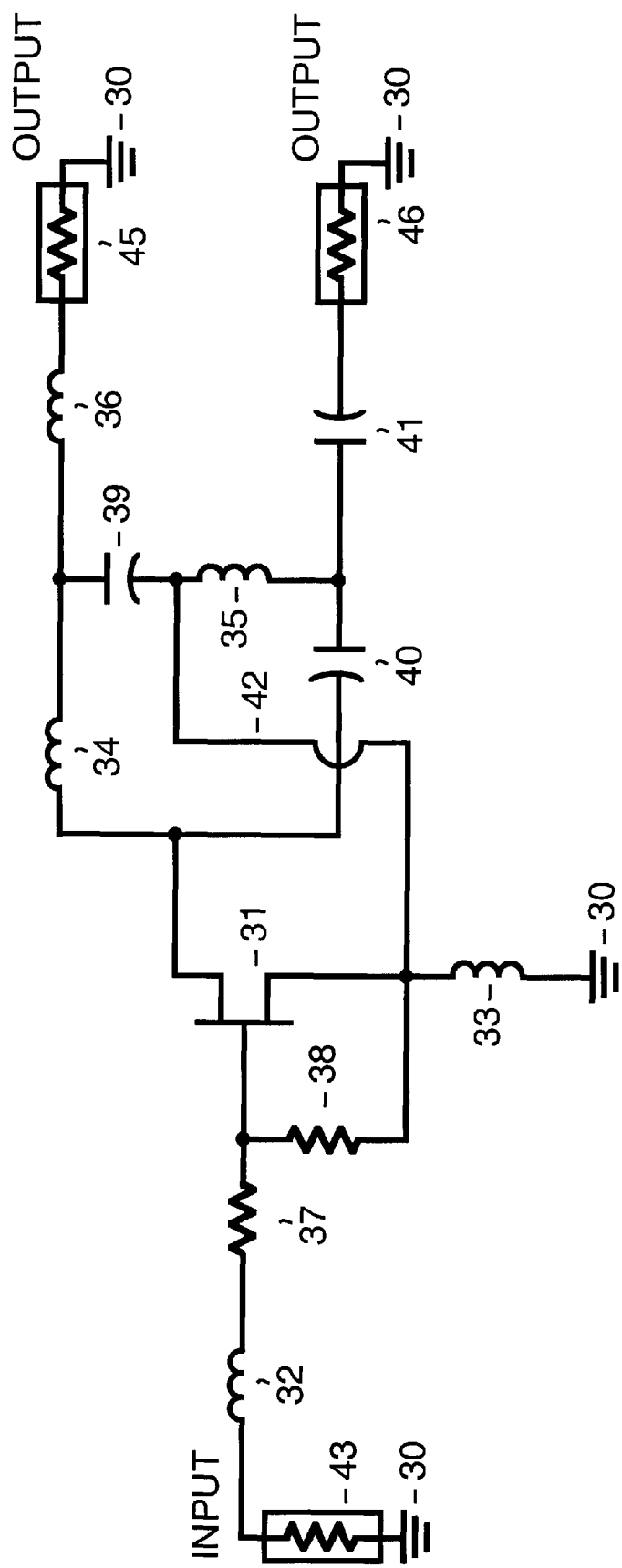
FIG. 3 shows a schematic representation of a common source balanced output amplifier circuit with output termination in accordance with an alternative preferred embodiment of the present invention.

FIG. 3 shows a schematic representation of a common source balanced output amplifier circuit. The schematic is for an alternating current (AC) simulation so that DC biasing circuitry is omitted.

An amplifier stage of the amplifier circuit includes an FET 31, a resistance 37 and a resistance 38. As will be understood by persons of ordinary skill in the art, many other combinations may be used to accomplish the same purpose. For example, in some embodiments, resistance 37 and resistance 38 can be eliminated entirely. In other embodiments resistance 37 and resistance 38 can be replaced by a suitable combination of reactive elements.

An output stage (balun) of the amplifier circuit includes an inductance 34, an inductance 35, an inductance 36, a capacitance 39, a capacitance 40, and a capacitance 41, connected as shown. Also shown are an input port terminator 43 connected to a ground 30, an input inductance 32, a common node inductance 33, an output port terminator 45 and an output port terminator 46. A line 42 connects the tail of the balun to the common node of the amplifier. In this case, the common node of the amplifier is the source of FET 31.

For example, the amplifier circuit has a start frequency of 0.8 Gigahertz (GHz), a stop frequency of 1.2 GHz and a step frequency of 0.01 GHz. Input port terminator 43 has an impedance of 350 Ohms. Inductance 32 has a value of 20 nH. Resistance 37 has a resistance of 90 Ohms. Resistance 38 has a resistance of 50 Ohms. FET 31 has a width of 1000 micrometers, a gate-to-source voltage ($V_{GS}$) equal to 0.5 volts and a drain-to-source voltage ($V_{DS}$) equal to 3 volts. Common node inductance 33 has a value of 2 nH. Inductance 34 has a value of 6.2 nH. Inductance 36 has a value of 0.83 nH. Inductance 35 has a value of 6.3 nH. Capacitance 40 has a value of 4.2 pF. Capacitance 39 has a value of 4.2 pF. Capacitance 41 has a value of 19.5 pF. Output port terminator 45 has an impedance of 25 Ohms. Output port terminator 46 has an impedance of 25 Ohms.

Figure 4:
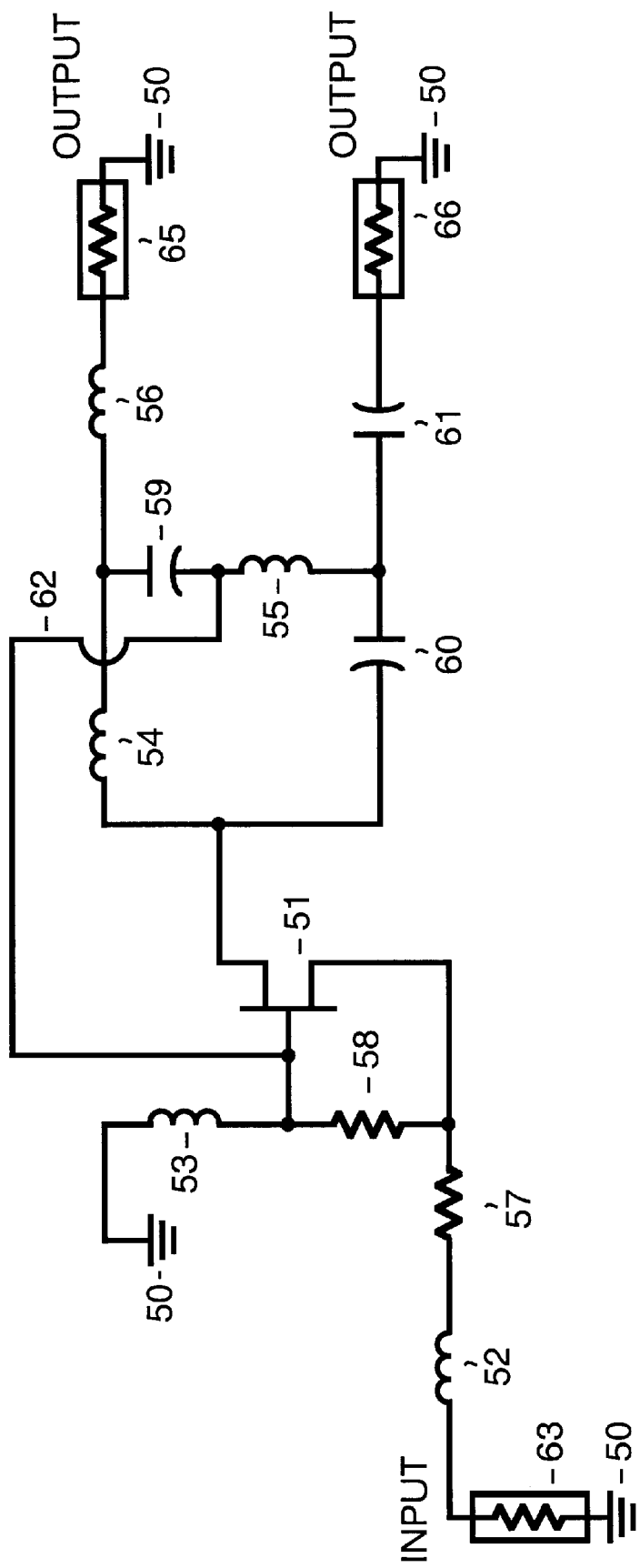
FIG. 4 shows a schematic representation of a common gate balanced output amplifier circuit with output termination in accordance with an alternative preferred embodiment of the present invention.

FIG. 4 shows a schematic representation of a common gate balanced output amplifier circuit. The schematic is for an alternating current (AC) simulation so that DC biasing circuitry is omitted.

An amplifier stage of the amplifier circuit includes an FET 51, a resistance 57 and a resistance 58. As will be understood by persons of ordinary skill in the art, many other combinations may be used to accomplish the same purpose. For example, in some embodiments, resistance 57 and resistance 58 can be eliminated entirely. In other embodiments resistance 57 and resistance 58 can be replaced by a suitable combination of reactive elements.

An output stage (balun) of the amplifier circuit includes an inductance 54, an inductance 55, an inductance 56, a capacitance 59, a capacitance 60, and a capacitance 61, connected as shown. Also shown are an input port terminator 63 connected to a ground 50, an input inductance 52, a common node inductance 53, an output port terminator 65 and an output port terminator 66. A line 62 connects the tail of the balun to the common node of the amplifier. In this case, the common node of the amplifier is the gate of FET 51.

For example, the amplifier circuit has a start frequency of 0.8 Gigahertz (GHz), a stop frequency of 1.2 GHz and a step frequency of 0.01 GHz. Input port terminator 63 has an impedance of 350 Ohms. Inductance 52 has a value of 20 nH. Resistance 57 has a resistance of 90 Ohms. Resistance 58 has a resistance of 50 Ohms. FET 51 has a width of 1000 micrometers, a gate-to-source voltage ($V_{GS}$) equal to 0.5 volts and a drain-to-source voltage ($V_{DS}$) equal to 3 volts. Common node inductance 53 has a value of 2 nH. Inductance 54 has a value of 6.2 nH. Inductance 56 has a value of 0.83 nH. Inductance 55 has a value of 6.3 nH. Capacitance 60 has a value of 4.2 pF. Capacitance 59 has a value of 4.2 pF. Capacitance 61 has a value of 19.5 pF. Output port terminator 65 has an impedance of 25 Ohms. Output port terminator 66 has an impedance of 25 Ohms.

Figure 5:
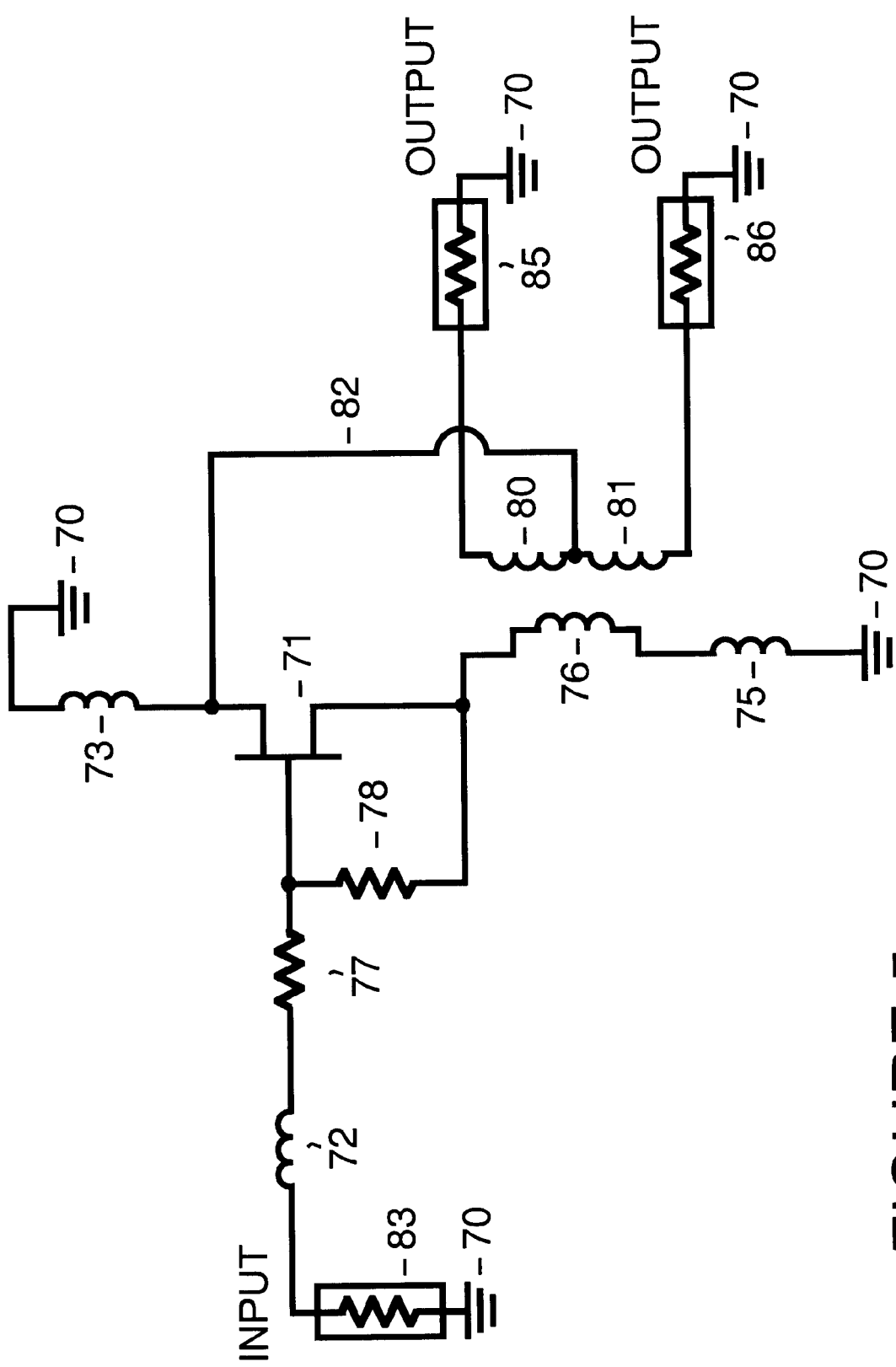
FIG. 5 shows a schematic representation of a common drain balanced output amplifier circuit in accordance with an alternative preferred embodiment of the present invention.

FIG. 5 shows a schematic representation of a common drain output amplifier circuit with a transformer balun. The schematic is for an alternating current (AC) simulation so that DC biasing circuitry is omitted.

An amplifier stage of the amplifier circuit includes an FET 71, a resistance 77 and a resistance 78. As will be understood by persons of ordinary skill in the art, many other combinations may be used to accomplish the same purpose. For example, in some embodiments, resistance 77 and resistance 78 can be eliminated entirely. In other embodiments resistance 77 and resistance 78 can be replaced by a suitable combination of reactive elements.

An output stage (balun) of the amplifier circuit includes a transformer having a primary coil 76 and secondary coil sections 80 and 81. Also shown are an input port terminator 83 connected to a ground 70, an input inductance 72, a common node inductance 73, an inductance 75, an output port terminator 85 and an output port terminator 86. A line 82 connects the tail of the balun to the common node of the amplifier. In this case, the common node of the amplifier is the drain of FET 71. The tail of the balun is located at a center tap of the secondary coil of the transformer.

For example, the amplifier circuit has a start frequency of 0.8 Gigahertz (GHz), a stop frequency of 1.2 GHz and a step frequency of 0.01 GHz. Input port terminator 83 has an impedance of 350 Ohms. Inductance 72 has a value of 20 nH. Resistance 77 has a resistance of 90 Ohms. Resistance 78 has a resistance of 50 Ohms. FET 71 has a width of 1000 micrometers, a gate-to-source voltage ($V_{GS}$) equal to 0.5 volts and a drain-to-source voltage ($V_{DS}$) equal to 3 volts. Common node inductance 73 has a value of 2 nH. Inductance 75 has a value of 2 nH. Output port terminator 85 has an impedance of 25 Ohms. Output port terminator 86 has an impedance of 25 Ohms.

While FIG. 5 shows a common drain amplifier topology, as will be understood by persons of ordinary skill in the art, a transformer balun may be used with a common source amplifier topology, a common gate amplifier topology, a bipolar transistor amplifier topology, a tube amplifier topology or some other form of amplifier topology.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. An amplifier circuit comprising:
   an amplifier stage of the amplifier circuit, the amplifier stage including a common node connected to an external ground, wherein an inductance is located between the common node and the external ground; and,
   a balun stage of the amplifier circuit connected to the amplifier stage, the balun stage including a balun tail;
   wherein the balun tail is directly connected to the common node of the amplifier stage so that a resulting connection between the balun tail and the common node bypasses the inductance between the common node and the external ground.

2. An amplifier circuit as in claim 1 wherein the inductance between the common node and the external ground results, at least partially, from at least one of the following:
   a bond wire;
   a package lead.

3. An amplifier circuit as in claim 1 wherein the amplifier stage includes a field-effect transistor (FET) and the common node of the amplifier stage is a drain of the FET.

4. An amplifier circuit as in claim 1 wherein the amplifier stage includes a field-effect transistor (FET) and the common node of the amplifier stage is a source of the FET.

5. An amplifier circuit as in claim 1 wherein the amplifier stage includes a field-effect transistor (FET) and the common node of the amplifier stage is a gate of the FET.

6. An amplifier as in claim 1 wherein the balun stage comprises a lumped element inductance-capacitance (L-C) ladder structure.

7. An amplifier as in claim 1 wherein the balun stage comprises a transformer.

8. An amplifier circuit as in claim 1:
   wherein the amplifier stage comprises:
      a field-effect transistor (FET) having a gate, a source and a drain, and
      stabilizing and impedance matching elements coupled to the FET;
   wherein the balun stage comprises:
      a first capacitor having a first end connected to the balun tail and a second end,
      a first inductance having a first end connected to the balun tail and a second end,
      a second inductance having a first end connected to the source of the FET and a second end connected to the second end of the first capacitor,
      a third inductance having a first end connected to the second end of the first capacitor,
      a second capacitance having a first end connected to the source of the FET and a second end connected to the second end of the first inductance, and
      a third capacitance having a first end connected to the second end of the first capacitor; and,
   wherein the drain of the FET is the common node of the amplifier stage.

9. An amplifier circuit as in claim 1:
   wherein the amplifier stage comprises:
      a field-effect transistor (FET) having a gate, a source and a drain, and
      stabilizing and impedance matching elements coupled to the FET;
   wherein the balun stage comprises:
      a first capacitor having a first end connected to the balun tail and a second end,
      a first inductance having a first end connected to the balun tail and a second end,
      a second inductance having a first end connected to the drain of the FET and a second end connected to the second end of the first capacitor,
      a third inductance having a first end connected to the second end of the first capacitor,
      a second capacitance having a first end connected to the drain of the FET and a second end connected to the second end of the first inductance, and
      a third capacitance having a first end connected to the second end of the first capacitor; and,
   wherein the source of the FET is the common node of the amplifier stage.

10. An amplifier circuit as in claim 1:
    wherein the amplifier stage comprises:
       a field-effect transistor (FET) having a gate, a source and a drain, and
       stabilizing and impedance matching elements coupled to the FET;
    wherein the balun stage comprises:
       a first capacitor having a first end connected to the balun tail and a second end,
       a first inductance having a first end connected to the balun tail and a second end,
       a second inductance having a first end connected to the drain of the FET and a second end connected to the second end of the first capacitor,
       a third inductance having a first end connected to the second end of the first capacitor,
       a second capacitance having a first end connected to the drain of the FET and a second end connected to the second end of the first inductance, and
       a third capacitance having a first end connected to the second end of the first capacitor; and,
    wherein the gate of the FET is the common node of the amplifier stage.

11. A method for stabilizing an amplifier circuit comprising following step:
    (a) making an electrical connection between a balun tail of a balun stage of the amplifier circuit directly to a common node of an amplifier stage of the amplifier circuit, including the following substep:
       (a.1) making the connection in such a way that the connection bypasses an inductance between the common node and an external ground.

12. A method as in claim 11 wherein the amplifier stage includes a field-effect transistor (FET) and the common node of the amplifier stage is a drain of the FET.

13. A method as in claim 11 wherein the amplifier stage includes a field-effect transistor (FET) and the common node of the amplifier stage is a source of the FET.

14. A method as in claim 11 wherein the amplifier stage includes a field-effect transistor (FET) and the common node of the amplifier stage is a gate of the FET.

15. An amplifier circuit comprising:
- an amplifier means for amplifying an input signal to the amplifier circuit, the amplifier means including a common node connected to an external ground, wherein an inductance is located between the common node and the external ground; and,
- a balun means for balancing an output signal of the amplifier circuit, the balun means including a balun tail;
- wherein the balun tail is directly connected to the common node of the amplifier means so that a resulting connection between the balun tail and the common node bypasses the inductance between the common node and the external ground.

16. An amplifier circuit as in claim 15 wherein the inductance between the common node and the external ground results, at least partially, from at least one of the following:
- a bond wire;
- a package lead.

17. An amplifier circuit as in claim 15 wherein the amplifier means includes a field-effect transistor (FET) and the common node of the amplifier stage is a drain of the FET.

18. An amplifier circuit as in claim 15 wherein the amplifier means includes a field-effect transistor (FET) and the common node of the amplifier stage is a source of the FET.

19. An amplifier circuit as in claim 15 wherein the amplifier means includes a field-effect transistor (FET) and the common node of the amplifier stage is a gate of the FET.

20. An amplifier as in claim 15 wherein the balun means comprises a lumped element inductance-capacitance (L-C) ladder structure.

21. An amplifier as in claim 15 wherein the balun means comprises a transformer.

* * * * *